(12) United States Patent
Ogura

(10) Patent No.: US 10,279,368 B2
(45) Date of Patent: May 7, 2019

(54) COATING METHOD AND COATING APPARATUS

(71) Applicant: SCREEN Holdings Co., Ltd., Kyoto (JP)

(72) Inventor: Hiroyuki Ogura, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 40 days.

(21) Appl. No.: 14/946,875

(22) Filed: Nov. 20, 2015

(65) Prior Publication Data

US 2016/0151801 A1 Jun. 2, 2016

(30) Foreign Application Priority Data

Nov. 28, 2014 (JP) ................................. 2014-241954

(51) Int. Cl.
*B05D 1/00* (2006.01)
*B05C 11/06* (2006.01)
*B05C 5/02* (2006.01)
*B05B 1/04* (2006.01)
*B05D 3/04* (2006.01)
(Continued)

(52) U.S. Cl.
CPC ............ *B05C 5/0254* (2013.01); *B05B 1/044* (2013.01); *B05B 13/0228* (2013.01); *B05B 13/0421* (2013.01); *B05B 13/0442* (2013.01); *B05C 11/06* (2013.01); *B05D 1/005* (2013.01);
(Continued)

(58) Field of Classification Search
CPC .................................. B05D 1/005; B05D 3/04
See application file for complete search history.

(56) References Cited

U.S. PATENT DOCUMENTS

2001/0003964 A1* 6/2001 Kitano .................... G03F 7/162
118/50
2002/0043275 A1* 4/2002 Okuda .................... B08B 3/024
134/30
(Continued)

FOREIGN PATENT DOCUMENTS

JP S60-171115 A 9/1985
JP H05-259050 A 10/1993
(Continued)

OTHER PUBLICATIONS

Office Action dated Apr. 17, 2017 for corresponding Korean Patent Application No. 10-2015-0164568.
(Continued)

*Primary Examiner* — Dah-Wei D. Yuan
*Assistant Examiner* — Kristen A Dagenais-Englehart
(74) *Attorney, Agent, or Firm* — Ostrolenk Faber LLP

(57) ABSTRACT

A slit opening of a slit nozzle extends unidirectionally in a longitudinal direction from near the center of a circular substrate to near an outer edge of the substrate, and has a length in the longitudinal direction equal to or smaller than a radius of the substrate. When the slit nozzle discharges chemical onto the substrate, a rotary holder rotates the substrate and the slit nozzle relatively to each other about the center of the substrate. Accordingly, the chemical from the slit nozzle all adheres to a surface of the substrate to form an excellent liquid column and a chemical film on an almost entire surface of the substrate along the outer edge of the circular substrate. This yields satisfactory coating of the substrate with the chemical while waste chemical is suppressed.

11 Claims, 9 Drawing Sheets

(51) Int. Cl.
  *B05B 13/02*  (2006.01)
  *B05B 13/04*  (2006.01)
  *G03F 7/16*  (2006.01)
  *H01L 21/67*  (2006.01)

(52) U.S. Cl.
  CPC ............... *B05D 3/04* (2013.01); *G03F 7/162* (2013.01); *H01L 21/6715* (2013.01)

(56) References Cited

U.S. PATENT DOCUMENTS

| | | | |
|---|---|---|---|
| 2004/0071872 A1* | 4/2004 | Kawase | H01L 21/6715 427/240 |
| 2007/0295610 A1* | 12/2007 | Chen | B23H 5/08 205/663 |
| 2008/0057194 A1* | 3/2008 | Tanaka | G03F 7/162 427/240 |
| 2009/0162547 A1 | 6/2009 | Sawada et al. | 427/240 |
| 2012/0135358 A1 | 5/2012 | Tanaka | 430/434 |

FOREIGN PATENT DOCUMENTS

| | | | |
|---|---|---|---|
| JP | 11162808 A | * | 6/1999 |
| JP | 11162808 A | * | 6/1999 |
| JP | H11-162808 | | 6/1999 |
| JP | 2005-028227 A | | 2/2005 |
| JP | 2006-122857 A | | 5/2006 |
| JP | 2006-198485 A | | 8/2006 |
| JP | 2008-60462 A | | 3/2008 |
| KR | 10-2008-0077016 | | 8/2008 |
| TW | 200519927 A | | 6/2005 |

OTHER PUBLICATIONS

Office Action dated Jun. 1, 2017 for corresponding Taiwan Patent Application No. 104139154.
Office Action dated Apr. 3, 2018 in corresponding Japanese Patent Application No. 2014-241954.
Notice of Allowance dated Nov. 13, 2018 in corresponding Japanese Patent Application No. 2014-241954.

* cited by examiner

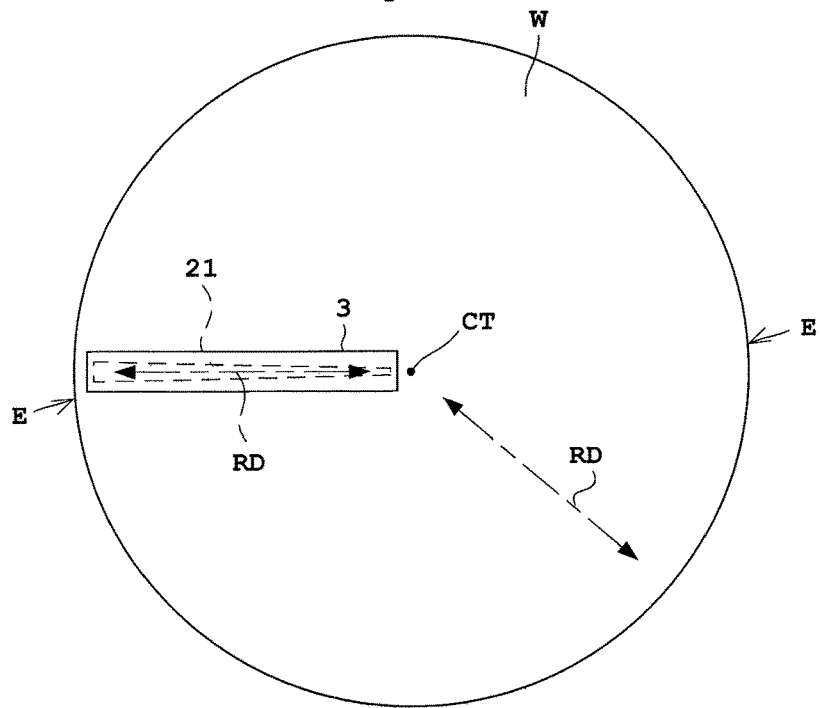
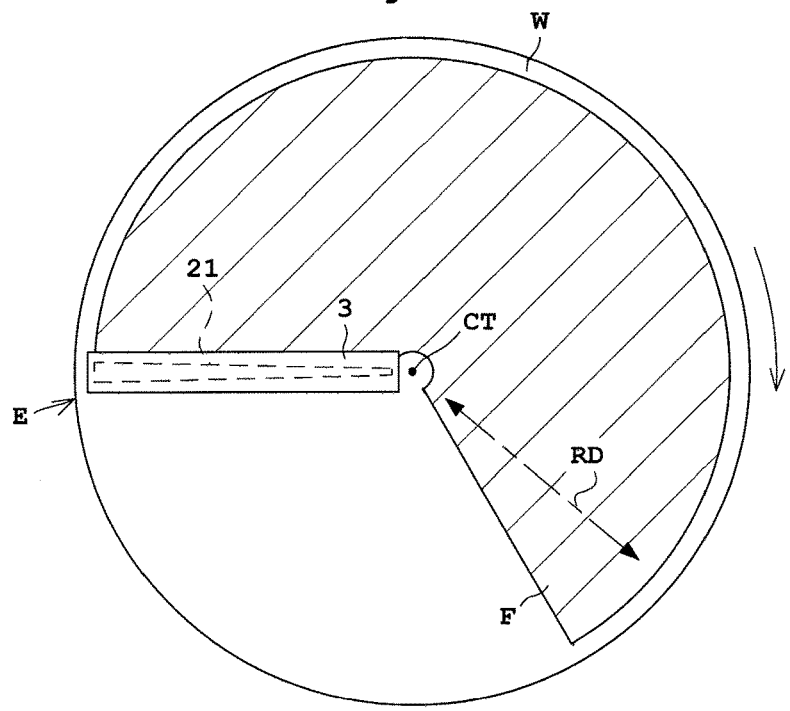

VIEW ON ARROW D

COATING METHOD AND COATING APPARATUS

CROSS-REFERENCE TO RELATED APPLICATIONS

This application claims priority to Japanese Patent Application No. 2014-241954 filed Nov. 28, 2014 the subject matter of which is incorporated herein by reference in entirety.

TECHNICAL FIELD

The present invention relates to a coating method and a coating apparatus for coating with chemical (chemical liquid) having high viscosity circular (disk) substrates such as semiconductor substrates, glass substrates for liquid crystal display, glass substrates for photomask, and optical disk substrates.

BACKGROUND ART

A currently-used coating apparatus includes a rotary holder for rotating while holding a substrate in a substantially horizontal attitude, and a nozzle for discharging chemical, such as resist, to the substrate. See, for example, Japanese Unexamined Patent Publication No. H11-162808A. The coating apparatus supplies the chemical from the nozzle to the center of the substrate, and the rotary holder rotates the substrate at high speeds. This causes the chemical to be distributed over the substrate to form a chemical film.

SUMMARY OF INVENTION

Technical Problem

However, the currently-used apparatus possesses the following problems. Specifically, in a spin coating system, the rotation causes the chemical to be distributed over the substrate. As a result, some chemical may be abandoned wastefully out of the substrate. Especially, chemical with higher viscosity is unlikely to be distributed over the substrate, leading to the need for a large amount of chemical. Accordingly, a large amount of chemical is wastefully abandoned out of the substrate. This results in cost disadvantage when high-priced chemical is used.

In the spin coating system, a thick film generated through rotation has a thickness smaller than a target thickness of the thick film. In this case, a two-layered film is formed by two-time coating, for example. Accordingly, more chemical is wastefully abandoned. In addition, a processing time becomes longer.

In contrast to this, examples other than the spin coating system include a scan coaxing system in which, as illustrated in FIG. 1, chemical is applied while a slit nozzle 103 moves unidirectionally above a square substrate (rectangular substrate). If a circular substrate W is coated by this system, a region SH illustrated by oblique lines in FIG. 1 is generated where chemical is wastefully abandoned.

Moreover, in the scan coating system, an uneven gap is maintained between an outlet of the slit nozzle 103 and the circular substrate W. In particular, the substrate W cannot be coated uniformly with chemical having high viscosity. That is, upon initiation of chemical discharge as illustrated in FIG. 2A, an excellent curtain-like liquid column is formed on the square substrate W, and the liquid column is kept unchanged. As a result, coating with an even thickness is obtainable. In contrast to this, upon initiation of chemical discharge as illustrated in FIG. 2B, the chemical contacts to only one point, i.e., an outer edge E of the circular substrate W. Accordingly, no excellent curtain-like liquid column is formed. As a result, no film having an even thickness is formed, causing uneven coating.

Moreover, when the slit nozzle is disposed above the center of the substrate and the substrate is rotated for being coated as described in Japanese Unexamined Patent Publication No. H11-162808A, the chemical wastefully abandoned can be suppressed. However, when the chemical is discharged to the center of the substrate, the chemical on the center is likely to have a large film thickness, and thus splash of the chemical may occur. Such chemical splash causes the slit nozzle to be contaminated. If the slit nozzle is contaminated with the chemical and the chemical is solidified and left, the chemical turns into particles to contaminate the substrate. Such a drawback may arise. The chemical on the slit nozzle may adhere to portions other than the slit nozzle. Alternatively, the contaminated portion of the slit nozzle causes coating with uneven thickness. Here in Japanese Unexamined Patent Publication No. 11-162808A, the chemical having viscosity of 11 cP (centipoise) is used.

The present invention has been made regarding the state of the art noted above, and its one object is to provide a coating method and a coating apparatus allowing satisfactory coating of a circular substrate with chemical while waste chemical is suppressed. Another object of the present invention is to prevent contamination of a slit nozzle.

Solution to Problem

The present invention is constituted as stated below to achieve the above object. One aspect of the present invention provides a coating method including a discharging step of discharging chemical onto a circular substrate with a slit nozzle having a slit opening; and a rotating step of rotating the substrate and the slit nozzle relatively to each other about the center of the substrate with a chemical discharging rotator during the discharging step of discharging the chemical with the slit nozzle, the slit opening extending unidirectionally in a longitudinal direction from near the center of the substrate to near, an outer edge of the substrate, and having a length of the slit opening in the longitudinal direction being equal to or smaller than a radius of the substrate.

With the coating method according to the aspect of the present invention, the slit opening of the slit nozzle extends unidirectionally in the longitudinal direction from near the center to near the outer edge of the circular substrate. Here, the length in the longitudinal direction is equal to or smaller than the radius of the substrate. When the slit nozzle having such a configuration discharges the chemical onto the substrate, the chemical discharging rotator rotates the substrate and the slit nozzle relatively to each other about the center of the substrate. Accordingly, the chemical from the slit nozzle all adheres to the surface of the substrate to form an excellent liquid column and a chemical film on an almost entire surface of the substrate along the outer edge of the circular substrate. This yields satisfactory coating of the substrate with the chemical while waste chemical is suppressed.

In addition, the film of the chemical discharged from the slit nozzle according to the aspect of the present invention allows integrated one connection of a start point and an end point of the chemical discharge. This yields a reduced part of the substrate having a possibly large film thickness.

Moreover, a shorter length of the slit nozzle in the longitudinal direction achieves difficulty in adhesion of stains and thus ready maintenance.

Moreover, it is preferred that the coating method according to the aspect of the present invention further includes a gas blowing step of blowing gas from a gas nozzle from above the substrate to a chemical film formed on the substrate after the discharging step of discharging the chemical. This yields a planar chemical film.

Moreover, it is preferred in the coating method according to the aspect of the present invention that the gas contains solvent vapor. If gas with no solvent vapor is blown to the chemical film, the solvent in the chemical at a portion of the substrate to which the gas is blown may possibly evaporate to dry the chemical. However, since the gas contains the solvent vapor in the aspect of the present invention, blowing the gas to the chemical film achieves suppressed vaporization and dry of the chemical.

Moreover, it is preferred that the coating method according to the aspect of the present invention further includes a moving step of moving the gas nozzle in a radial direction of the substrate by a gas nozzle moving unit during the gas blowing step of blowing the gas with the gas nozzle. This allows the gas to be blown to the chemical film while moving the gas nozzle in the radial direction of the substrate. For instance, this allows planarization of an increased film thickness of the chemical caused by overlapping the start point and the end point of the chemical discharge by the slit nozzle.

Moreover, it is preferred that the coating method according to the aspect of the present invention further includes a rotating step of rotating the gas nozzle and the substrate relatively to each other about the center of the substrate with a gas blowing rotator during the gas blowing step of blowing the gas with the gas nozzle. This allows blow of the gas to the chemical film while rotating the substrate and the gas nozzle relatively to each other about the center of the substrate. In addition, combination of such rotation to the move of the gas nozzle in the radius direction allows the gas nozzle to move to any positions within the substrate.

Moreover, it is preferred in the coating method according to the aspect of the present invention that a first end face of the slit opening adjacent to the outer edge of the substrate is inside the outer edge of the substrate. The chemical film formed over the outer edge of the substrate may possibly cause an arm of a substrate transport mechanism to be contaminated upon transporting the substrate. Such a problem may occur. On the other hand, in the above aspect, a chemical film F is not formed to an outer edge E. This obtains suppressed contamination of the arm of the substrate transport mechanism. Moreover, neither edge cut rinse nor back-side rinse is required. Moreover, the chemical is not distributed to the outer edge of the substrate. This requires no pre-wet processing. Accordingly, various types of processing are omitted. As a result, no processing liquid is used, whereby a reduced discharge amount of processing liquid is obtainable.

Moreover, it is preferred in the coating method according to the aspect of the present invention that a second end face of the slit opening adjacent to the center of the substrate is disposed outside the center of the substrate. If the chemical is discharged to the center of the substrate, the chemical film is likely to rise. Accordingly, the risen film may cause the discharged chemical to splash back to contaminate the slit nozzle. Here in this aspect, no chemical is discharged to the center of the substrate. This yields suppressed rise of the chemical film.

Moreover, in the coating method according to the aspect of the present invention, the slit opening is wider from near the center of the substrate to near the outer edge of the substrate. The slit opening has various widths. This achieves a uniform discharge amount per unit in area, leading to suppressed coating unevenness in the radial direction of the substrate.

Moreover, in the coating method according to the aspect of the present invention, the slit nozzle has a discharge amount of chemical gradually increasing from near the center of the substrate to near the outer edge of the substrate. The slit nozzle has various chemical discharge amounts. This achieves a uniform discharge amount per unit in area, leading to suppressed coating unevenness in the radial direction of the substrate.

Moreover, it is preferred in the coating method according to the aspect of the present invention that the slit nozzle has a gap between the slit opening thereof and a surface of the substrate gradually increasing from near the center of the substrate to near the outer edge of the substrate. Since the chemical discharge amount is larger at the outer edge of the substrate than at the center of the substrate, controlling a level of the slit nozzle to be optimal to the chemical discharge amount yields a uniform film thickness of the substrate. In addition, contamination of the slit nozzle caused by splash back of the chemical is avoidable.

Moreover, in the coating method according to the aspect of the present invention, the chemical discharging rotator is rotated by less than 360 degrees. Accordingly, a clearance can be provided between the start point and the end point of the chemical discharge by the slit nozzle. This yields prevention of an increased chemical film thickness due to overlapped chemical film and contamination of the slit nozzle caused by splash back of the discharged chemical.

Moreover, in the coating method according to the aspect of the present invention, the chemical has viscosity of 300 cP or more and 10000 cP or less. This achieves suppression of waste chemical with high viscosity, and thus achieves excellent coating of the circular substrate with the chemical.

Moreover, another aspect of the present invention provides a coating apparatus including a slit nozzle with a slit opening and discharging chemical to a circular substrate; and a chemical discharging rotator rotating the slit nozzle and the substrate relatively to each other about the center of the substrate while the slit nozzle discharges the chemical, the slit opening extending unidirectionally in a longitudinal direction from near the center of the substrate to near an outer edge of the substrate and having a length in the longitudinal direction equal to or smaller than a radius of the substrate.

With the coating apparatus according to the other aspect of the present invention, the slit opening of the slit nozzle extends unidirectionally in the longitudinal direction from near the center of the circular substrate to near the outer edge of the substrate, and has a length in the longitudinal direction equal to or smaller than the radius of the substrate. When the slit nozzle discharges the chemical to the substrate, the chemical discharging rotator rotates the substrate and the slit nozzle relatively to each other about the center of the substrate. Accordingly, the chemical from the slit nozzle all adheres to the surface of the substrate to form an excellent liquid column and a chemical film on an almost entire surface of the substrate along the outer edge of the circular substrate. This yields satisfactory coating of the substrate with the chemical while waste chemical is suppressed.

In addition, the film of the chemical discharged from the slit nozzle according to the aspect of the present invention allows integrated one connection of the start point and the end point of the chemical discharge. This yields a reduced part of the substrate having a possibly large film thickness. Moreover, a shorter length of the slit nozzle in the longitudinal direction achieves difficulty in adhesion of stains and thus ready maintenance.

Advantageous Effects of Invention

With the coating method and the coating apparatus according to the aspects of the present invention, the slit opening of the slit nozzle extends unidirectionally in the longitudinal direction from near the center of the circular substrate to near the outer edge of the substrate, and has a length in the longitudinal direction equal to or smaller than a radius of the substrate. When the slit nozzle discharges the chemical to the substrate, the chemical discharging rotator rotates the substrate and the slit nozzle relatively to each other about the center of the substrate. Accordingly, the chemical from the slit nozzle all adheres to the surface of the substrate to form an excellent liquid column and a chemical film on an almost entire surface of the substrate along the outer edge of the circular substrate. This yields satisfactory coating of the substrate with the chemical while waste chemical is suppressed.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 4A is a plan view illustrating arrangement of a slit nozzle and a slit opening. FIG. 4B is a plan view illustrating chemical coating.

EMBODIMENT 1

Figure 3:
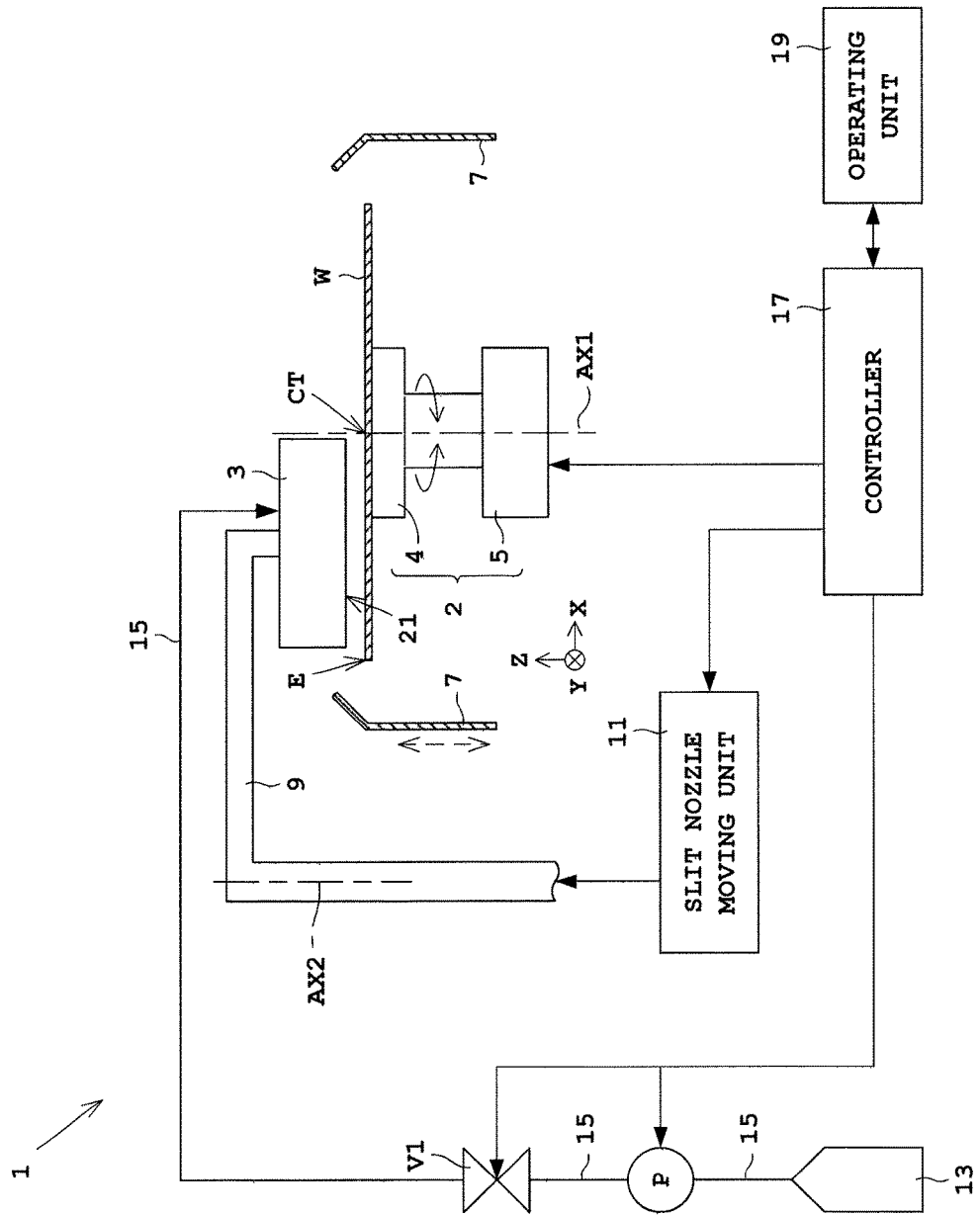
FIG. 3 schematically illustrates a coating apparatus according to Embodiment 1 of the present invention.

The following describes Embodiment 1 of the present invention with reference to drawings. FIG. 3 schematically illustrates a coating apparatus 1 according to Embodiment 1. FIG. 4A is a plan view illustrating arrangement of a slit nozzle 3 and a slit opening 21. FIG. 4B is a plan view illustrating chemical coating.

Reference is made to FIG. 3. The coating apparatus 1 includes a rotary holder 2 rotating a substrate W in a substantially horizontal attitude, and a slit nozzle 3 discharging chemical onto the substrate W. Here, chemical with high viscosity is used. Examples of the chemical include an adhesive, chemical for planarized film formation, and resist. The viscosity of the chemical is, for example, equal to or more than 300 cP (centipoise), and is equal to or less than 10000 cP.

The rotary holder 2 includes a spin chuck 4 holding the substrate W rotatably about a rotary shaft AX1, and a rotary drive unit 5 rotating the spin chuck 4 about the rotary shaft AX1. The spin chuck 4 suction-holds a rear face of the substrate W, thereby holding the substrate W in a substantially horizontal attitude. The rotary drive unit 5 is formed by a motor and the like. Here, the rotary holder 2 corresponds to the chemical discharging rotator in the present invention. The rotary shaft AX1 substantially conforms to the center CT of the substrate W.

A cup 7 is provided lateral to the rotary holder 2 for surrounding the rotary holder 2. The cup 7 is moved vertically by a drive unit, not shown.

The slit nozzle 3 is supported by an arm 9. The slit nozzle 3 supported by the arm 9 reciprocates between a standby pot (not shown) outside the cup 7 and a given position above the substrate W with a slit nozzle moving unit 11. The slit nozzle moving unit 11 moves the slit nozzle 3 in at least any of an X-direction (first horizontal direction), a Y-direction (second horizontal direction), and a Z-direction (vertical direction). Here, the slit nozzle moving unit 11 may rotate the slit nozzle 3 around a rotary shaft AX2. The slit nozzle moving unit 11 is formed by a motor, a guide rail, and the like.

The chemical is supplied from a chemical supplying source 13 to the slit nozzle 3. The chemical is supplied from the chemical supplying source 13 through a chemical pipe 15 to the slit nozzle 3. The chemical pipe 15 has an open/close valve V1 for supplying the chemical and stopping supply of the chemical, a pump P, and the like, each interposingly arranged on the chemical pipe 15.

The coating apparatus 1 includes a controller 17 controlling elements of the coating apparatus 1, a memory unit (not shown) formed by a hard disk and the like and storing operating conditions of the coating apparatus 1, and an operating unit 19 with a display unit and an input unit. The controller 17 is formed by a central processing unit (CPU). The display unit of the operating unit 19 is formed by a liquid crystal monitor and the like. The input unit is formed by a joystick, a mouse, a keyboard, a button, and the like.

The following describes the slit nozzle 3 in detail. As illustrated in FIGS. 3 and 4A, the slit nozzle 3 includes the slit opening 21. The slit opening 21 extends unidirectionally from near the center CT of the circular substrate W to near an outer edge E of the substrate W. The slit opening 21 has a longitudinal length smaller than a radius of the substrate W. For instance, the slit opening 21 has a longitudinal length of less than 150 mm for a substrate W whose diameter is 300 mm. The slit opening 21 does not extend over the center CT.

The slit nozzle 3 with the above slit opening 21 discharges chemical onto the substrate W. During this, the rotary holder 2 rotates the substrate W about the center CT (rotary shaft AX1). See FIG. 4B. That is, the slit nozzle 3 discharges chemical while the slit nozzle 3 and the substrate W rotate relatively to each other about the center CT of the substrate W. Then, discharge of the chemical is performed until substantially one rotation is finished, and then the discharge of the chemical is stopped. Accordingly, a chemical film F is formed (applied) on almost the entire surface of the substrate W along the outer edge E of the circular substrate W.

Figure 5A:
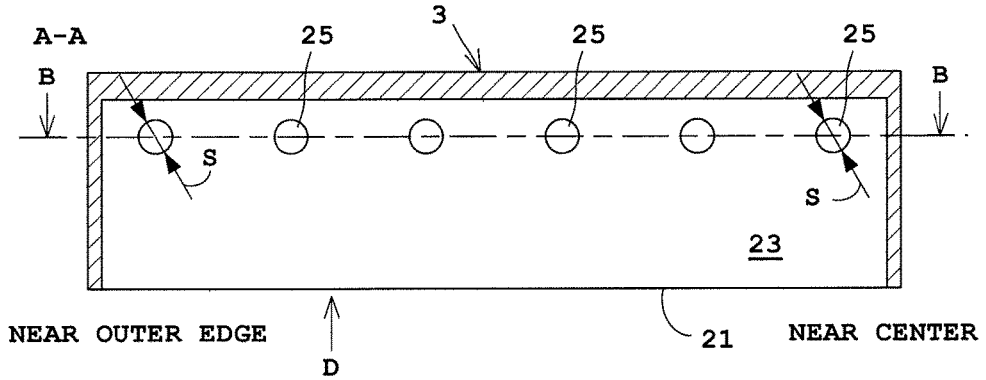
FIG. 5A is a longitudinal sectional view of the slit nozzle.
Figure 5B:
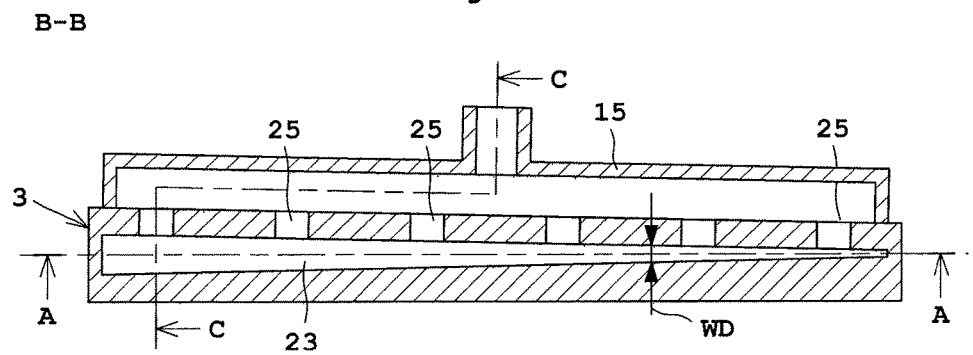
FIG. 5B is a cross sectional view of the slit nozzle.
Figure 5C:
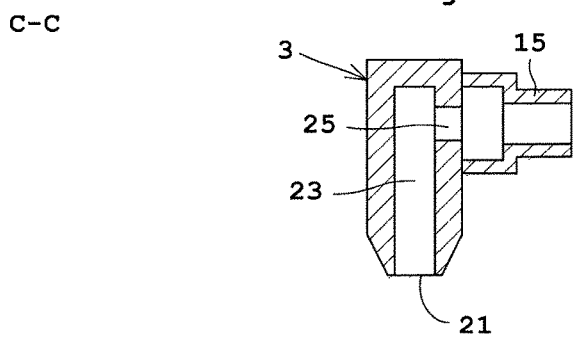
FIG. 5C is a longitudinal sectional view of the slit nozzle in a width direction.

FIGS. 5A to 5D each illustrate the slit nozzle 3. FIG. 5A is a longitudinal sectional view seen from an arrow A-A in FIG. 5B. FIG. 5B is a view seen from an arrow B-B in FIG. 5A. FIG. 5C is a view seen from an arrow C-C in FIG. 5B. As illustrated in FIGS. 5A to 5C, the slit nozzle 3 includes an internal passage 23 flowing the chemical, a plurality of supply ports 25 provided on a first side of the internal passage 23 for supplying the chemical to the internal passage 23, and a slit opening 21 provided on a second side of the internal passage 23 for discharging the chemical.

Figure 5D:
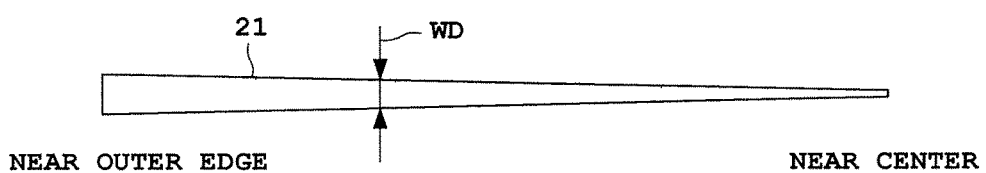
FIG. 5D illustrates a shape of the slit opening.

As illustrated in FIG. 5D, the slit opening 21 has a width WD gradually increasing from near the center CT of the substrate W to near the outer edge E of the substrate W. This allows a discharge amount of the chemical discharged onto the substrate W to gradually increase from near the center CT to near the outer edge E of the substrate W. That is, a variation in width WD of the slit opening 21 yields a uniform discharge amount per unit in area, leading to suppressed coating unevenness in a radius direction RD of the substrate W. Here in the present embodiment, the supply ports 25 each have the same opening diameter (opening area) S.

In FIG. 5B, the internal passage 23 has a width WD gradually increasing from near the center CT of the substrate W to near the outer edge E in the same manner as the slit opening 21. However, the following is applicable to this. That is, the width WD of the internal passage 23 adjacent to the supply ports 25 is constant from near the center CT of the substrate W to near the outer edge E of the substrate W, whereas the width WD decreases gradually from the supply ports 25 to the slit opening 21 like the width WD of the slit opening 21 in FIG. 5D. Alternatively, the internal passage 23 may have the width WD constant from near the center CT of the substrate W to near the outer edge E of the substrate W and decreasing adjacent to the slit opening 21 to be a shape as in FIG. 5D.

Figure 6:
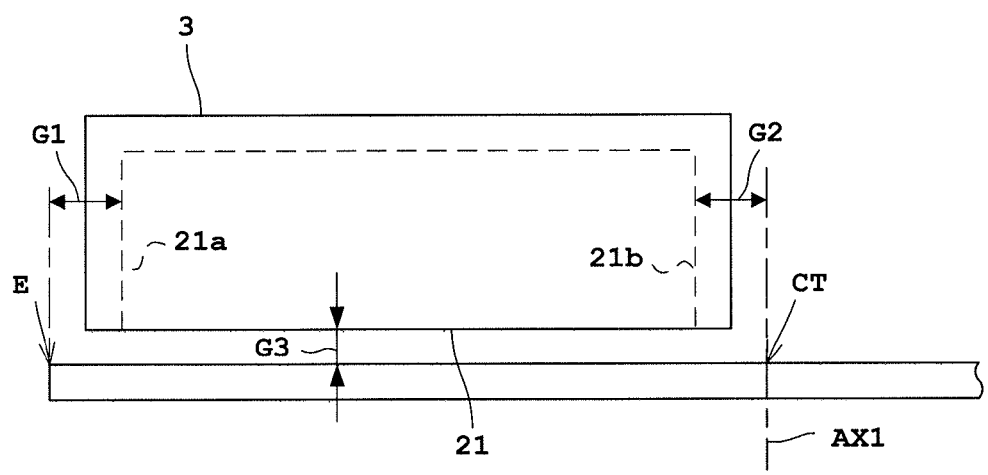
FIG. 6 illustrates both end faces of the slit opening in a longitudinal direction.

Moreover, as illustrated in FIG. 6, the slit opening 21 has a first end face 21a adjacent to the outer edge E of the substrate W. The first end face 21a is disposed inside the outer edge E of the substrate W. For instance, for the circular substrate W whose diameter is 300 mm, the first end face 21a of the slit opening 21 is disposed inside the outer edge E by around 2 mm. In this case, a gap G1 is approximately 2 mm.

Moreover, as illustrated in FIG. 6, the slit opening 21 has a second end face 21b adjacent to the center CT of the substrate W. The second end face 21b is disposed outside the center CT of the substrate W. For instance, for the circular substrate W whose diameter is 300 mm, the second end face 21b of the slit opening 21 is disposed away from the center CT by 0.5 to 1 mm, i.e., disposed outside the center CT. In this case, a gap G2 is approximately from 0.5 to 1 mm. Here in the present embodiment, the slit opening 21 is not provided above the center CT.

The following describes operation of the coating apparatus 1.

Reference is made to FIG. 3. A substrate transport mechanism, not shown, transports the substrate W to the rotary holder 2. The spin chuck 4 of the rotary holder 2 holds the substrate W. The cup 7 moves upward to a given level.

After the substrate W is transported, the slit nozzle moving unit 11 moves the slit nozzle 3 from the standby pot (not shown) to a give position above the substrate W. When the slit nozzle 3 is moved to the given position, the slit opening 21 of the slit nozzle 3 is disposed so as to extend unidirectionally from near the center CT of the circular substrate W to near the outer edge E of the substrate W along the radius direction RD, as illustrated in FIGS. 3 and 4A. Under this condition, the slit nozzle 3 discharges the chemical onto the substrate W.

While the slit nozzle 3 discharges the chemical, i.e., from start to end of the chemical discharge, the rotary holder 2 holds and rotates the substrate W about the center CT (rotary shaft AX1) approximately once. Consequently, the slit nozzle 3 and the substrate W rotate relatively to each other about the center CT of the substrate W approximately once. Moreover, the substrate W may be rotated before the discharge of the chemical starts. Moreover, the substrate W may be rotated continuously after the chemical discharge.

Figure 1:
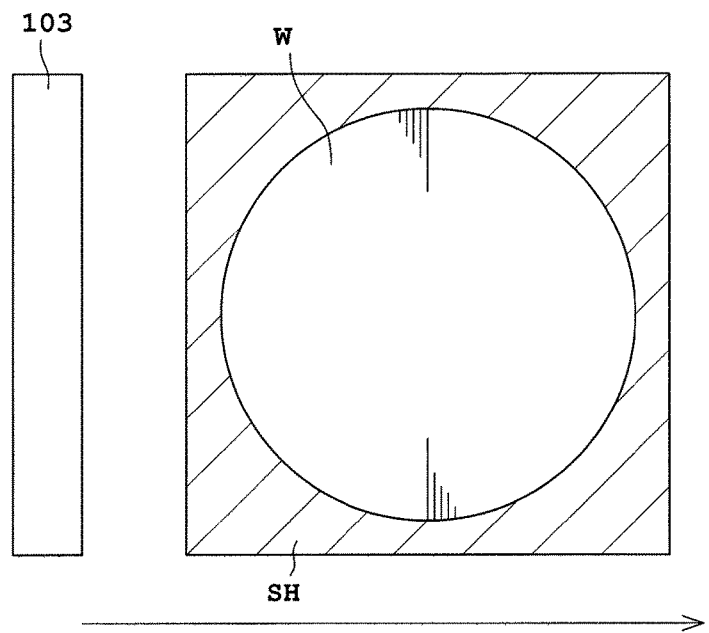
FIG. 1 illustrates a problem of a scan system crossing a substrate unidirectionally.
Figure 2A:
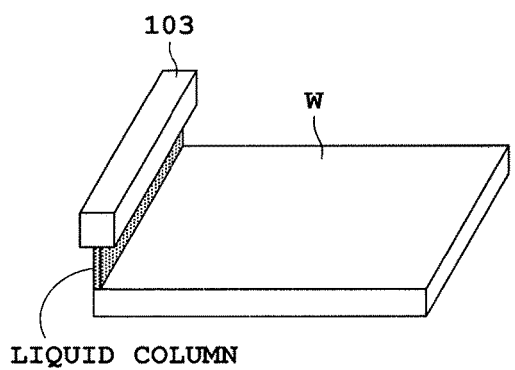
FIGS. 2A and 2B each illustrate a problem of a scan system crossing a substrate unidirectionally.
Figure 2B:
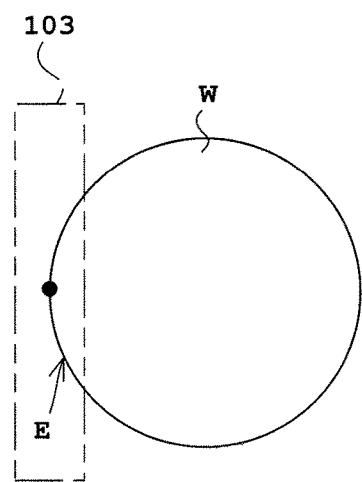

The chemical discharged from the slit nozzle 3 all adheres to the surface of the substrate W, whereby an excellent liquid column is formed. In addition, the chemical film F is formed on almost the entire surface of the substrate W so as to draw a circle along the outer edge E of the circular substrate W. Accordingly, no chemical is discharged out of the circular substrate W, which differs from FIG. 1. This suppresses waste chemical. Moreover, the chemical film F is formed while the excellent liquid column is formed as in FIG. 2A, leading to satisfactory coating of the substrate W with the chemical.

Moreover, the rotary holder 2 rotates the substrate W while the chemical is discharged at a number of rotations (rotation speed) at which the chemical adhering to the substrate W does not run out of the substrate W by a centrifugal force. In other words, the substrate W is rotated slowly at low speeds. Consequently, no chemical is discharged outside the substrate W, leading to further suppression of the waste chemical. In addition, the substrate W is not rotated at high speeds as in the spin coating system, leading to no mist caused by the chemical and the like. Then the cup 7 containing a less amount of exhaust gas than that in the spin coating system is obtainable. This achieves suppressed operation energy for the apparatus.

After the chemical film F is formed, the slit nozzle moving unit 11 moves the slit nozzle 3 from the given position above the substrate W to the standby pot (not shown). If the substrate W is being rotated, the rotary holder 2 stops the rotation of the substrate W, and releases holding of the substrate W. Thereafter, the cup 7 is moved downward. The substrate transport mechanism (not shown) transports the substrate W on the spin chuck 4.

In the aspect of the present embodiment, the slit opening 21 of the slit nozzle 3 extends unidirectionally in the longitudinal direction from near the center CT of the circular substrate W to near the outer edge E of the substrate W. The slit opening 21 has a length in the longitudinal direction smaller than the radius of the substrate W. When such a slit nozzle 3 discharges the chemical onto the substrate W, the rotary holder 2 rotates the slit nozzle 3 and the substrate W relatively to each other about the center CT of the substrate W. Accordingly, the chemical from the slit nozzle 3 all adheres to the surface of the substrate W to form an excellent liquid column and the chemical film F on almost the entire surface of the substrate along the outer edge E of the circular substrate W. This yields satisfactory coating of the substrate W with the chemical while waste chemical is suppressed.

In addition, the film F of the chemical discharged from the slit nozzle 3 according to the aspect of the present invention allows integrated one connection (see an overlap portion OL in FIG. 8) of the start point and the end point of the chemical discharge. This yields a reduced part of the substrate having a possibly large film thickness. Moreover, a shorter length of the slit nozzle 3 in the longitudinal direction achieves difficulty in adhesion of stains and thus ready maintenance.

In addition, if the chemical film F is formed to the outer edge E of the substrate W, the arm (also referred to as a hand) of the substrate transport mechanism may be contaminated. Such a problem arises. However, the first end face 21a of the slit opening 21 adjacent to the outer edge E of the substrate W is actually disposed inside the outer edge E of the substrate W by the gap G1 in FIG. 6. This causes the chemical not to be distributed to the outer edge E of the substrate W, achieving suppressed contamination of the arm of the substrate transport mechanism. Moreover, the chemical film F is not formed to the outer edge E. Consequently, neither edge cut rinse nor back-side rinse is required. Moreover, the chemical is not distributed to the outer edge E of the substrate W. This requires no pre-wet processing. Accordingly, various types of processing are omitted. As a result, no processing liquid is used, whereby a reduced discharge amount of processing liquid is obtainable.

Moreover, the second end face 21b of the slit opening 21 adjacent to the center CT of the substrate W is disposed outside the center CT of the substrate W by the gap G2 in FIG. 6. If the chemical is discharged to the center CT of the substrate W, the chemical film F is likely to rise. Accordingly, the risen film F may cause the discharged chemical to splash back to contaminate the slit nozzle 3. Here in this aspect, no chemical is discharged to the center CT of the substrate W. This yields suppressed rise of the chemical film F.

The viscosity of the chemical is, for example, equal to or more than 300 cP (centipoise), and is equal to or less than 10000 cP. This achieves satisfactory coating of the circular substrate W with the chemical with high viscosity while waste chemical is suppressed.

EMBODIMENT 2

Figure 7:
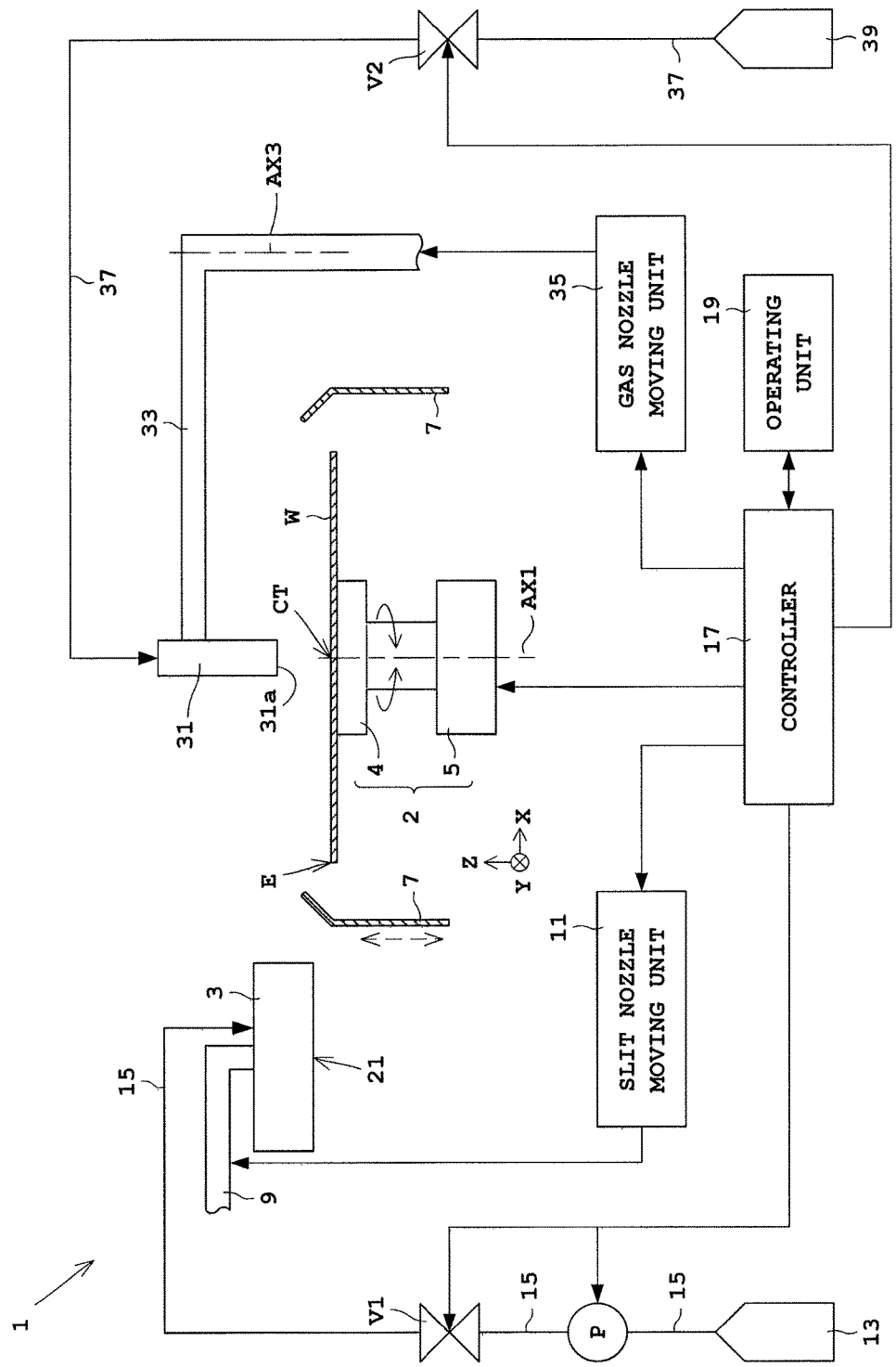
FIG. 7 schematically illustrates a coating apparatus according to Embodiment 2 of the present invention.
Figure 8:
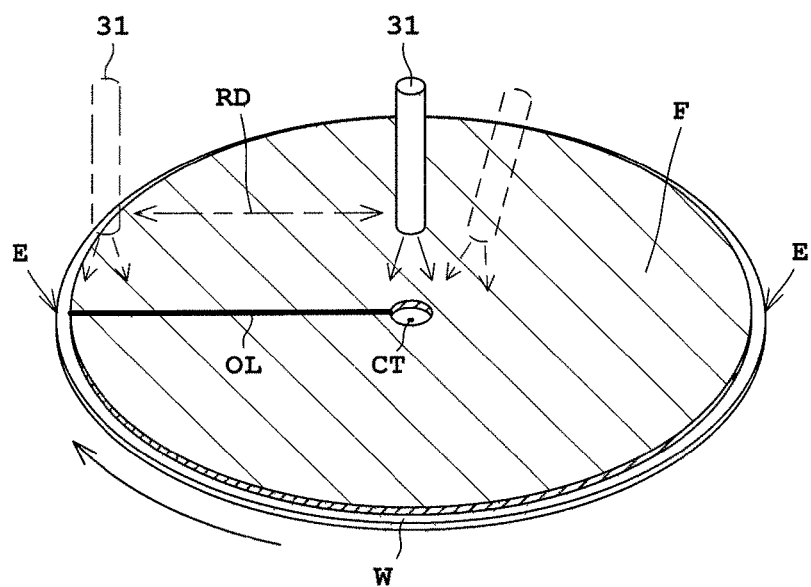
FIG. 8 illustrates planarization by blowing gas to a chemical film.

The following describes Embodiment 2 of the present invention with reference to drawings. Here, the description common to that of Embodiment 1 is to be omitted. FIG. 7 schematically illustrates a coating apparatus 1 according to Embodiment 2. FIG. 8 illustrates planarization by blowing gas to the chemical film F.

In Embodiment 1, the chemical is discharged, and thereafter the substrate transport mechanism transports the substrate W. However, in the present embodiment of the present embodiment, the chemical is discharged, and thereafter the film F of the chemical discharged onto the substrate W is subjected to planarization.

Reference is made to FIG. 7. The coating apparatus 1 includes, in addition to the elements in FIG. 3, a gas nozzle 31 blowing gas to the chemical film F on the substrate from above the substrate W after the chemical is discharged. Here in FIG. 7, the slit nozzle 3 is disposed in the standby pot, not shown.

The gas nozzle 31 is supported by the arm 33. The gas nozzle 31 supported by the arm 33 is moved by a gas nozzle moving unit 35 between a standby position outside the cup 7 and a pre-set given position above the substrate W. The gas nozzle moving unit 35 moves the gas nozzle 31 in at least any of the X-direction (first horizontal direction), the Y-direction (second horizontal direction), and the Z-direction (vertical direction). The gas nozzle moving unit 35 may also rotate the gas nozzle 31 about a rotary shaft AX3. The gas nozzle moving unit 35 is formed by a motor, a guide rail, and the like.

A gas supplying source 39 supplies gas to the gas nozzle 31 via a gas pipe 37. The gas pipe 37 has an open/close valve V2 interposingly arranged thereon for blowing gas and stopping blowing gas. A controller 17 controls the gas nozzle moving unit 35 and the open/close valve V2.

Examples of the gas blown to the chemical film F include inactive gas such as nitrogen, air, and other types of gas. Moreover, the gas may contain solvent vapor (evaporated solvent). The solvent is, for example, made from the same solvent contained in the chemical. If only nitrogen, for example, containing no solvent vapor is blown to the chemical film F, the solvent in the chemical at a portion of the substrate to which the nitrogen is blown may possibly evaporate to dry the chemical. However, the gas contains the solvent vapor. Consequently, even when the gas is blown to the chemical film F, it is avoidable for the solvent in the chemical to evaporate and be dried.

The following describes operation of the coating apparatus 1 according to the aspect of the present embodiment.

As illustrated in FIG. 4B, the slit nozzle 3 discharges the chemical while the substrate W rotates approximately once. This forms a chemical film F on the substrate W. On the other hand, an overlap OL is generated between the start point and the end point of the discharge by the slit nozzle 3, as illustrated in FIG. 8. The overlap OL rises and has a projection. The overlap OL is planarized by blowing the gas. The slit nozzle 3 is moved to the standby pot.

As illustrated in FIG. 8, the gas nozzle moving unit 35 moves the gas nozzle 31 above the overlap OL or an extension of the overlap OL of the start point and the end point of the chemical discharge. While the gas is blown, the gas nozzle moving unit 35 moves the gas nozzle 31 in the radius direction RD of the substrate W. This achieves blowing of the gas to the overlap OL (on the chemical film F) while the gas nozzle 31 is moved in the radius direction RD. Consequently, a planarized overlap OL is obtainable. Here, movement of the gas nozzle 31 in the radius direction RD may be made from near the center CT to near the outer edge E, and vice versa. Moreover, the gas nozzle 31 may reciprocate in the radius direction RD once or a plurality of times.

Moreover, the gas may be blown while the gas nozzle 31 is moved in the radius direction RD when the rotary holder 2 rotates the substrate W. This achieves blow of the gas to the chemical film F while the gas nozzle 31 and the substrate W rotate relatively to each other about the center CT of the substrate W. In addition, combination to the move of the gas nozzle 31 in the radius direction RD achieves movement of the gas nozzle 31 to any positions within the substrate W. Moreover, as illustrated in FIG. 8, the gas nozzle 31 blows the gas directly below to the substrate W in the substantially horizontal attitude. In this case, as illustrated by dotted lines in FIG. 8, the gas nozzle 31 may blow the gas obliquely downward to the outside in the radius direction RD (outer edge E). Here, the rotary holder 2 corresponds to the gas blowing rotator in the present invention.

The following describes one example of blowing the gas. The gas nozzle 31 blows the gas obliquely downward to the outside in the radius direction RD. The gas nozzle 31 is moved from near the center CT to near the outer edge E in a gas blowing direction by the gas nozzle 31 while the substrate W is rotated at low speeds. This causes the chemical to flow to planarize the film. Here, the substrate W is rotated at a number of rotations (rotation speed) at which the chemical adhering to the substrate W does not run out of the substrate W by a centrifugal force.

After the chemical film F is planarized, the gas nozzle moving unit 35 moves the gas nozzle 31 to the standby position outside the cup 7. If the substrate W is rotated, the rotary holder 2 stops the rotation of the substrate W, and releases holding of the substrate W. Thereafter, the cup 7 is moved downward. The substrate transport mechanism transports the substrate W on the spin chuck 4.

With the aspect of the present embodiment, the gas nozzle 31 blows gas from above the substrate W to the chemical film F formed by discharging the chemical to the substrate W. This yields planarization of the chemical film F.

Here in the present embodiment, the gas nozzle 31 includes a single gas blow port 31a in FIG. 7. In this case, a plurality of (multi) blow ports may be provided, or the gas blow port may be slit-like.

In the present embodiment, the gas nozzle 31 is moved to the radius direction RD. However, the gas nozzle 31 may be fixed in the radius direction RD as necessary when blowing the gas. For instance, movement of the gas nozzle 31 to the radius direction RD may be omitted as long as the gas can be blown in the longitudinal direction along the radius direction RD, for example, with the slit-like port.

The present invention is not limited to the foregoing examples, but may be modified as follows.

(1) In the above Embodiment 2, the chemical is discharged, and thereafter, planarization is performed to the chemical film F on the substrate W by blowing the gas to the chemical film F. However, the planarization may be performed by rotating the substrate W about the center CT (rotary shaft AX1) with the rotary holder 2. In this case, the substrate W is rotated at a number of rotations (rotation speed) at which the chemical adhering to the substrate W does not run out of the substrate W by a centrifugal force. Accordingly, this requires no element for blowing gas, such as the gas nozzle 31, leading to a simplified configuration. Here, a number of rotations upon the planarization may be different from that when the chemical is discharged.

Figure 9:
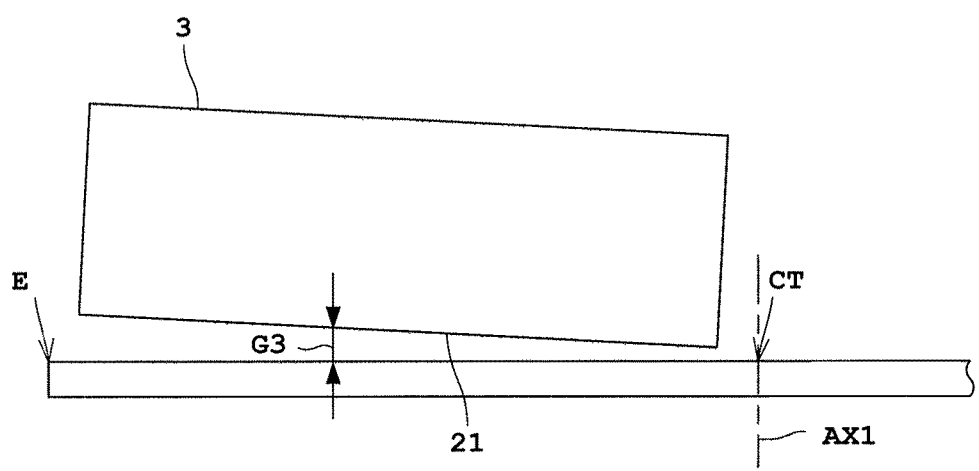
FIG. 9 illustrates a gap between the slit opening and the substrate.

(2) In the above embodiments and modification (1), the gap G3 between the slit opening 21 of the slit nozzle 3 and the surface of the substrate W is constant from near the center CT to near the outer edge E of the substrate W as illustrated in FIG. 6. Alternatively, as illustrated in FIG. 9, the slit nozzle 3 may be formed such that the gap G3 between the slit opening 21 and the surface of the substrate W gradually increases from near the center CT of the substrate W to near the outer edge E of the substrate W. Since the chemical discharge amount is larger at the outer edge E of the substrate W than at the center CT of the substrate W, controlling the level of the slit opening 21 optimal to the discharge amount allows formation of the film having a uniform thickness. Moreover, contamination of the slit nozzle 3 caused by splash back of the discharged chemical can be avoided.

(3) In the above embodiments and the modifications, the slit opening 21 has a width WD gradually increasing from near the center CT to near the outer edge of the substrate W as illustrated in FIG. 5D. However, the slit nozzle 3 may be formed such that a chemical amount supplied to the slit nozzle 3 gradually increases from near the center CT to near the outer edge E of the substrate W. Accordingly, a discharge amount of chemical to be discharged to the substrate W can increase gradually from near the center CT to near the outer edge E of the substrate W, and thus a uniform discharge amount per unit in area is obtainable. This yields suppression in coating unevenness of the substrate W in the radius direction RD.

Figure 10A:
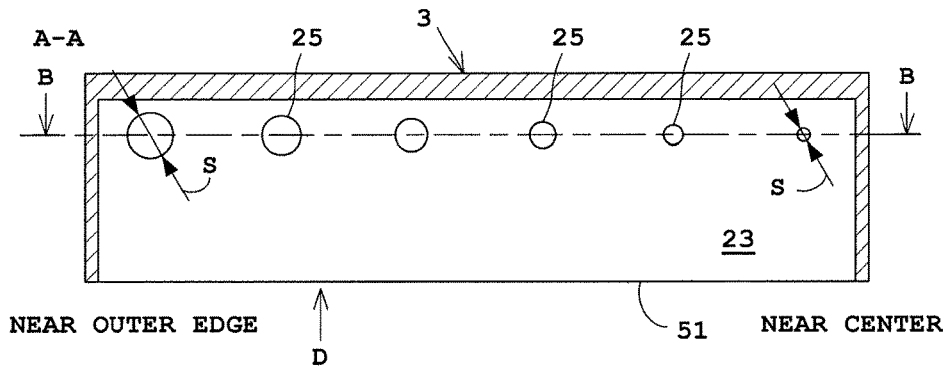
FIG. 10A is a longitudinal sectional view of a slit nozzle according to one modification of the present invention.
Figure 10B:
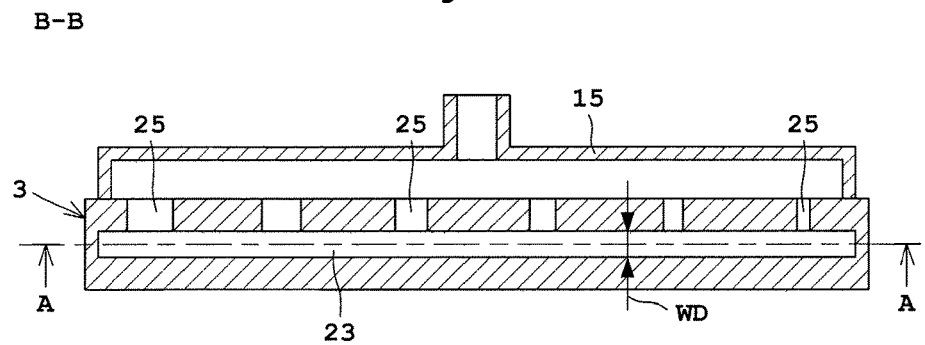
FIG. 10B is a cross sectional view of the slit nozzle according to the modification.
Figure 10C:
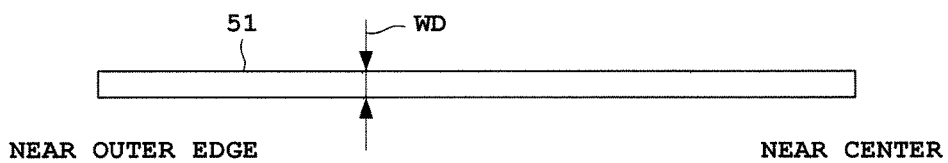
FIG. 10C illustrates a shape of a slit opening according to the modification.

As illustrated in FIG. 10A, the supply ports 25 are provided. The supply ports 25 have opening diameters S gradually increasing from near the center CT to near the outer edge E. As illustrated in FIG. 10B, the internal passage 23 has a width WD constant from near the center CT to near the outer edge E. As illustrated in FIG. 10C, the slit opening 51 also has a width WD constant from near the center CT to near the outer edge E. Moreover, the chemical amount supplied to the slit nozzle 3 in FIG. 5A may also gradually increase from near the center CT to near the outer edge E in the same manner as that in FIG. 10A.

Figure 10D:
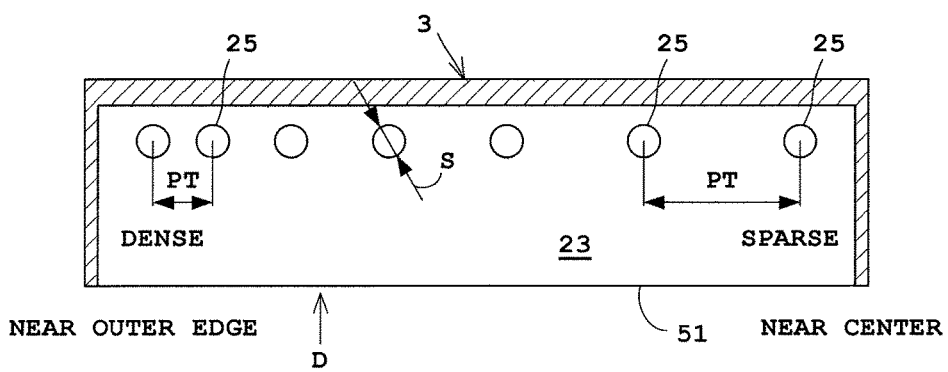
FIG. 10D is a longitudinal sectional view of the slit nozzle according to the modification.

Alternatively, instead of the configuration in FIG. 10A, the supply ports 25 may be disposed so as to have pitches PT gradually decreasing from near the center CT to near the outer edge E of the substrate W although the supply ports 25 have the same opening diameter S as in FIG. 10D. That is, the slit nozzle 3 may be formed such that the chemical amount supplied to the slit nozzle 3 gradually increases from near the center CT to near the outer edge E of the substrate W.

(4) In the above embodiments and modifications, the substrate W is rotated approximately once, and then, upon completion of chemical discharge to the substrate W (i.e., stop of chemical supply), the slit nozzle moving unit 11 moves the slit nozzle 3 slightly upward. Such may be adopted. This avoids contamination of the slit nozzle 3.

(5) In the above embodiments and modifications, the rotary holder 2 rotates the substrate W relatively to the slit nozzle 3 about the center CT while the slit nozzle 3 discharges the chemical. However, the slit nozzle moving unit 11 may rotate the slit nozzle 3 relatively to the substrate W about the center CT (rotary shaft AX1). In this case, the slit nozzle 3 is rotated similarly at a number of rotations (rotation speed) at which the chemical adhering to the substrate W does not run out of the substrate W by a centrifugal force.

(6) In the above embodiments and modifications, the rotary holder 2 rotates the substrate W relatively to the gas nozzle 31 about the center CT (rotary shaft AX1) while the gas nozzle 31 blows the gas. However, the gas nozzle moving unit 35 may rotate the gas nozzle 31 relatively to the substrate W about the center CT (rotary shaft AX1).

(7) In the above embodiments and modifications, the slit nozzle 3 and the substrate W are rotated about the center CT approximately once when the chemical is discharged onto the substrate W. Here, the rotation by the substrate holder 2 may be less than 360 degrees. This yields a clearance between the start point and the end point of chemical discharge from the slit nozzle 3. This avoids an increased chemical film thickness due to overlapped chemical film F as the overlap OL in FIG. 8 and contamination of the slit nozzle 3 caused by splash back of the discharged chemical. Here, the clearance between the start point and the end point of chemical discharge is compensated through planarization such as gas blow.

Figure 11:
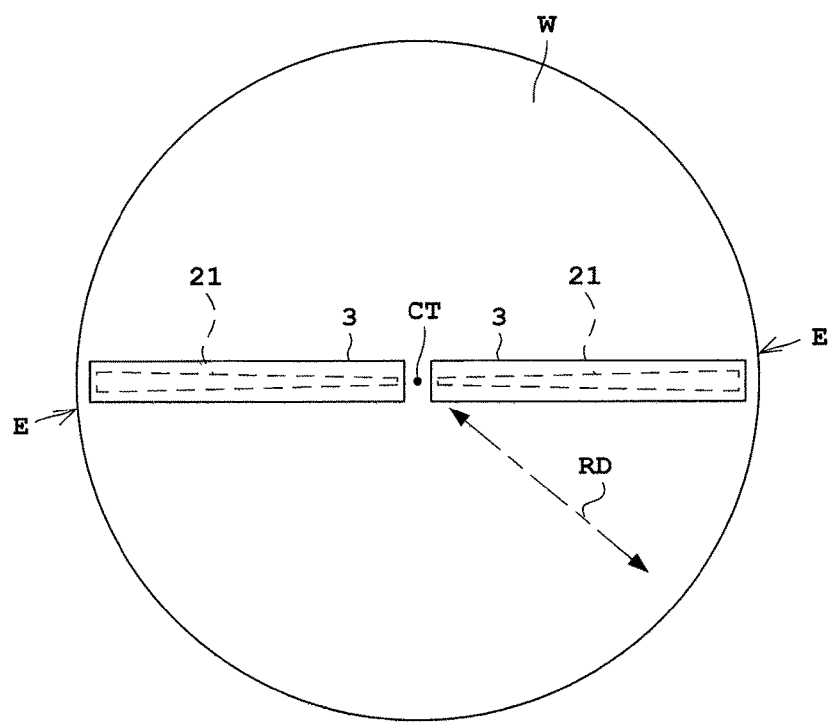
FIG. 11 illustrates arrangement of the slit nozzle and the slit opening according to the modification.

(8) In the above embodiments and modifications, the single slit nozzle 3 is provided. However, as illustrated in FIG. 11, a plurality of (two or more) slit nozzles 3 may be provided annularly from around the center CT of the substrate W. For instance, when two slit nozzles 3 are provided as in FIG. 11, the rotary holder 2 merely performs approximately half rotation (i.e., approximately 180 degrees) while the chemical is discharged. On the other hand, this generates two overlaps OL of FIG. 8, leading to a problem that a portion required for planarization increases.

Moreover, the two slit nozzles 3 in FIG. 11 may be formed singly, and the single slit nozzle 3 includes two slit openings 21 so as not to discharge the chemical to the center CT of the substrate W. In addition, the two slit openings 21 may be connected to be one as long as the chemical film F has a small thickness on the center CT of the substrate W.

(9) In the above embodiments and modifications, the substrate W is rotated approximately once while the slit nozzle 3 discharges the chemical onto the substrate W. However, the rotation may be two or more times. In this case, the level of the slit nozzle 3 is controlled so as not to contaminate the slit nozzle 3.

(10) In the above embodiments and modifications, the slit opening 21 has a longitudinal length smaller than the radius of the substrate W. However, the length may be equal to the radius. For instance, for the substrate W whose diameter is 300 mm, the slit opening 21 has a longitudinal length of 150 mm.

(11) In the above embodiments and modifications mentioned above, an extension of the end face of the slit opening 21 adjacent to the center CT passes above the center CT when seen the substrate W from above. However, the slit opening 21 may be inclined such that the extension of the end face of the slit opening 21 adjacent to the center CT does not pass above the center CT.

The present invention may be embodied in other specific forms without departing from the spirit or essential attributes thereof and, accordingly, reference should be made to the appended claims, rather than to the foregoing specification, as indicating the scope of the invention.

What is claimed is:

1. A coating method of coating chemical, comprising:
a discharging step of discharging chemical onto a circular substrate with a slit nozzle having a slit opening;
a rotating step of rotating the substrate and the slit nozzle relatively to each other about the center of the substrate with a chemical discharging rotator during the discharging step of discharging the chemical with the slit nozzle, the slit opening extending unidirectionally in a longitudinal direction from near the center of the substrate to near an outer edge of the substrate, and having a length in the longitudinal direction being equal to or smaller than a radius of the substrate;
a first moving step of moving a gas nozzle by a gas nozzle moving unit above an overlap or a clearance of a chemical film generated between a start point and an end point of chemical discharge or an extension of the overlap or the clearance;
a gas blowing step of blowing gas from the gas nozzle above the substrate directly onto the chemical film formed on the substrate after the discharging step of discharging the chemical;
a second moving step of moving the gas nozzle in a radial direction of the substrate by the gas nozzle moving unit during the gas blowing step of blowing the gas directly from the gas nozzle; and
rotating the substrate and the slit nozzle relatively to each other by one time and performing planarization by blowing the gas to at least the overlap or the clearance of the chemical film.

2. The coating method according to claim 1, wherein the gas contains solvent vapor.

3. The coating method according to claim 1, wherein a first end face of the slit opening adjacent to the outer edge of the substrate is disposed inside the outer edge of the substrate.

4. The coating method according to claim 1, wherein a second end face of the slit opening adjacent to the center of the substrate is disposed outside the center of the substrate.

5. The coating method according to claim 3, wherein a second end face of the slit opening adjacent to the center of the substrate is disposed outside the center of the substrate.

6. The coating method according to claim 1, wherein the slit opening is wider from near the center of the substrate to near the outer edge of the substrate.

7. The coating method according to claim 1, wherein the slit nozzle has a discharge amount of chemical gradually increasing from near the center of the substrate to near the outer edge of the substrate.

8. The coating method according to claim 7, wherein the slit nozzle has a gap between the slit opening thereof and a surface of the substrate gradually increasing from near the center of the substrate to near the outer edge of the substrate.

9. The coating method according to claim 1, wherein the chemical discharging rotator is rotated by less than 360 degrees.

10. The coating method according to claim 1, wherein the chemical has viscosity of 300 cP or more and 10000 cP or less.

11. The coating method according to claim 1, comprising performing said planarization by blowing the gas to at least said clearance of the chemical film generated between the start point and the end point of chemical discharge.

* * * * *